United States Patent [19]

Shibuya et al.

[11] Patent Number: 5,203,925
[45] Date of Patent: Apr. 20, 1993

[54] APPARATUS FOR PRODUCING A THIN FILM OF TANTALUM OXIDE

[75] Inventors: Munehiro Shibuya, Katano; Masatoshi Kitagawa, Hirakata; Takeshi Kamada, Ikeda; Takashi Hirao, Moriguchi; Hiroshi Nishizato, Narita, all of Japan

[73] Assignee: Matsushita Electric Industrial Co., Ltd., Osaka, Japan

[21] Appl. No.: 901,555

[22] Filed: Jun. 19, 1992

[30] Foreign Application Priority Data

Jun. 20, 1991 [JP] Japan .................................. 3-148594
Jun. 20, 1991 [JP] Japan .................................. 3-148595

[51] Int. Cl.$^5$ .............................................. C23C 16/00
[52] U.S. Cl. ........................................ 118/724; 118/725; 118/726
[58] Field of Search ......................... 118/724, 725, 726

[56] References Cited

U.S. PATENT DOCUMENTS

| | | | |
|---|---|---|---|
| 4,924,936 | 5/1990 | McKown | 118/726 |
| 4,936,889 | 6/1990 | Greenham | 118/726 |
| 5,049,405 | 9/1991 | Cheung | 118/726 |
| 5,078,092 | 1/1992 | Antos | 118/726 |

Primary Examiner—Richard Bueker
Attorney, Agent, or Firm—Ratner & Prestia

[57] ABSTRACT

An apparatus for producing a thin film of tantalum oxide comprising a vacuum chamber with a heater, an ampule of an organic tantalum compound, a container of a carrier gas, a container of an oxygen-containing gas, and a three way valve having a liquid inlet, a gas inlet and an outlet, the liquid inlet being connected with the ampule via a liquid flow controller, the gas inlet being connected with the containers of gas, the outlet being connected with the vacuum chamber, whereby the tantalum compound vaporized at the three way valve can obtain constant supply by the flow controller regardless of the ambient temperature, resulting in the tantalum oxide film of uniform quality.

4 Claims, 5 Drawing Sheets

APPARATUS FOR PRODUCING A THIN FILM OF TANTALUM OXIDE

BACKGROUND OF THE INVENTION

1. Field of the Invention

This invention relates to an apparatus for producing a thin film of tantalum oxide, which is suitable for use as a capacitive insulating film of DRAMs (dynamic random access memories) for example.

2. Prior Art

In recent years, as a useful method for making a thin film of semiconductor or of dielectrics chemical vapor deposition (CVD) has been given attention, which consists of thermally decomposing and/or causing raw material gases to react in a vacuum chamber to form a film on a substrate. CVD is considered useful for making a thin film of tantalum oxide used as capacitive insulating film of semiconductor memories, and various methods have been tried, with a CVD apparatus comprising a vacuum chamber capable of being raised to a high temperature, to form a tantalum oxide film.

In the following, explanation is made on a conventinal apparatus for producing a thin film of tantalum oxide, referring to a schematic view given by FIG. 1.

The vacuum chamber 1 in which a substrate 3 consisting of polysilicon or tungsten silicide or such is laid is exhausted by a vacuum pump 2 to 0.5 to 10 Torr, and heated by a heater 4 to about 450° C. A raw material of liquid organic tantalum compound, for example, Ta-$(OC_2H_5)_5$ is prepared in an ampule 5, which is kept at 120° C. by a heater 6. The organic tantalum compound is carried by a inert carrier gas 8 such as He or Ar to a leading pipe 10, the carrier gas 8 being controlled by a flow controller 7 and bubbling in the ampule 5, and the leading pipe 10 being heated to about 150° C. by a heater 9. The carrier gas 8 containing tantalum compound is mixed with an oxygen-containing gas 12 in the leading pipe 10 to form a mixed gas, which is introduced into the chamber 1. The amount of flowing of the oxygen-containing gas 12 is controlled by a flow controller 11. The mixed gas introduced into the chamber 1 is thermally decomposed and reacts, and a thin film of tantalum oxide is formed on the substrate 3.

However, the CVD apparatus as described above had the shortcomings that, the organic tantalum compound, with a change of temperature of surrounding atmosphere or of heating temperature by the heater 6, has its temperature and flowing amount changed, resulting in difficulty of forming a film of uniform quality.

Also, the film-forming speed of the apparatus was slow, since the content of tantalum compound and oxygen in the mixed gas introduced into the chamber 1 is small due to necessary large amount of the carrier gas for bubbling.

SUMMARY OF THE INVENTION

It is an object of the present invention to provide an apparatus for producing a thin film of uniform quality of tantalum oxide.

It is another object of the invention to obtain an apparatus for producing a thin film of tantalum oxide capable of rapidly forming the film.

To attain the above objects, the apparatus for producing a thin film of tantalum oxide according to the invention comprises:

a vacuum chamber having a heater for heating the inside thereof;

an ampule of an organic tantalum compound;

a container of a carrier gas;

a container of an oxygen-containing gas;

a threeway valve having a liquid inlet, a gas inlet and an outlet, the liquid inlet being connected with the ampule via a liquid flow controller, the gas inlet being connected with the container of carrier gas and the container of oxygen-containing gas, and the outlet being connected with the vacuum chamber.

In the apparatus for producing a thin film of tantalum oxide according to the present invention, the organic tantalum compound with constant supply controlled in liquid phase by the liquid flow controller, is vaporized in the three way valve, and forwarded to the vacuum chamber.

Therefore, the supply amount of the organic compound is different from the volume control by the temperature control of the conventional bubbling method, and is kept constant no matter how the surrounding temperature is changed, resulting in a tantalum oxide film of uniform quality. Further, the vaporization of the liquid is different from the conventional bubbling, made by spouting of the mixed gas in the three way valve, and the consumption of the carrier gas is reduced, so that the content of the organic tantalum compound and oxygen in the mixed gas introduced into the vacuum chamber is increased, resulting in rapid formation of tantlum oxide film.

Also, instead of the appratus as described above in which the mixed gas is introduced to the three way valve, an apparatus in which a carrier gas only is introduced to the three way valve and the oxygen-containing gas is introduced to the inlet of the vacuum chamber can also rapidly produce tantalum oxide film of uniform qnality.

EMBODIMENT

Figure 1:
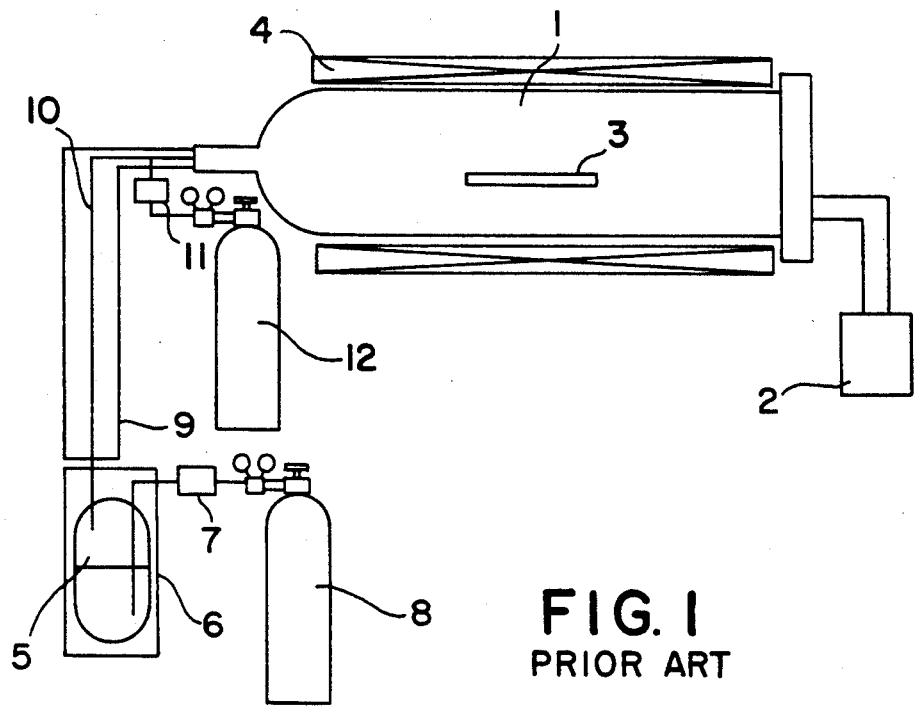
FIG. 1 shows a schematic view of a conventional apparatus for producing a tantalum oxside film.

Now, referring to the drawings, examples of the apparatus for producing a film of tantalum oxide embodying the present invention is explained below.

Embodiment 1

The apparatus for producing a film of tantalum oxide according to the present invention comprises a vacuum chamber 21, an ampule 27 of a liquid organic tantalum compound, $Ta(OC_2H_5)_5$, a container 31 of a carrier gas, a container 33 of an oxygen-containing gas and a three way valve 30.

In the vacuum chamber 21, a substrate 23 of polysilicon to be covered by a tantalum oxide film is laid. The ampule 27 of a liquid organic tantalum compound is provided with a means 26 to press out the liquid organic tantalum compound, which consists of a container 26 of helium gas to give pressure on the surface of the liquid. The three way valve 30 has a liquid inlet and a gas inlet, and an outlet.

The liquid inlet of the three way valve 30 is connected to the ampule 27 via a liquid-introducing pipe 29 and a liquid flow controller 28. The gas inlet is connected, through a gas-introducing pipe 35 to the container 31 of carrier gas and the container 33 of oxygen-containing gas. In the middle of the pipes to the containers, gas flow meters 32 and 34 are provided. The outlet of the three way valve is lead to a inlet of the vacuum chamber 21. The vacuum chamber 21 is provided with a vacuum pump 22, which exhaust the chamber to 1 Torr vacuum.

The chamber 21 is also equipped with a heater 24 at the outside and another heater 25 at the inside thereof. The former heats the chamber up to 250° C. and the latter heats the substrate 23 to some suitable temperature between 450° and 600° C.

The organic tantalum compound, $Ta(OC_2H_5)_5$, in the ampule 27, pressed by the He gas in the container 26, is transfered to the inlet of the three way valve 30 via the liquid flow controller 28 and the liquid-introducing pipe 29 at the rate of 0.01 g/min. The carrier gas from the container 31 of the carrier gas and the oxygen-containing gas, for this embodiment simple oxygen, from the container 33 of the oxygen-containing gas are introduced to the gas-introducing pipe 35 to form a mixed gas which is led to the gas inlet of the three way valve 30. The flows of the carrier gas and the oxygen-containing gas are controlled by flow controllers 32 and 34 respectively at 100 sccm. The organic tantalum oxide introduced to the liquid inlet in liquid state is vaporized in the three way valve 30 to form a mixed raw-material gas. The mixed raw-material gas is led from the outlet of the three way valve 30 through a gas-transferring pipe 36 into the vacuum chamber 21. The mixed raw-material gas is heated, while passing the gas-transferring pipe 36 to 250° C. by heater 37 for heating thereof, and reacts at the vicinity of the surface of the substrate 23 to deposit thereupon as a thin film of tantalum oxide.

Figure 3:
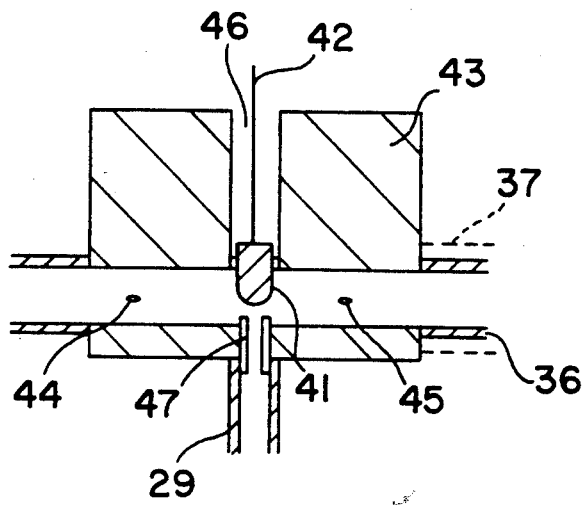
FIG. 3 is a section of a three way valve used in the apparatus shown in FIG. 2.

The structure of the three way valve 30 is explained below in more detail. Referring to FIG. 3, the three way valve comprises a housing 43, a liquid inlet 47, a gas inlet 44, an outlet 45, and a piston valve 41. The liquid inlet 47 and the gas inlet 44 are coupled with the liquid-introducing pipe 29 and the gas-introducing pipe 35 respectively. The inner diameter of the inlet 44 in made narrow in the vicinity of the piston valve 41. The piston valve 41 is movable up and down by a moving member 42, which is connected to some suitable means for the purpose. By adjusting the positions of the piston valve 41 by a moving member 42, the portion of the gas inlet 44 near the valve 41 is made narraw, causing the mixed gas to flow faster and the liquid organic tantalum compound to be vaporized.

Thus the liquid organic tantalum oxide, being of constant flow rate by the liquid flow controller 28, is vaporized by the three way valve 30, so that raw materials of a constant quantity is introduced to the vacuum chamber regardless of the ambient temperature and a tantalum oxide film of uniform quality is obtained.

Figure 2:
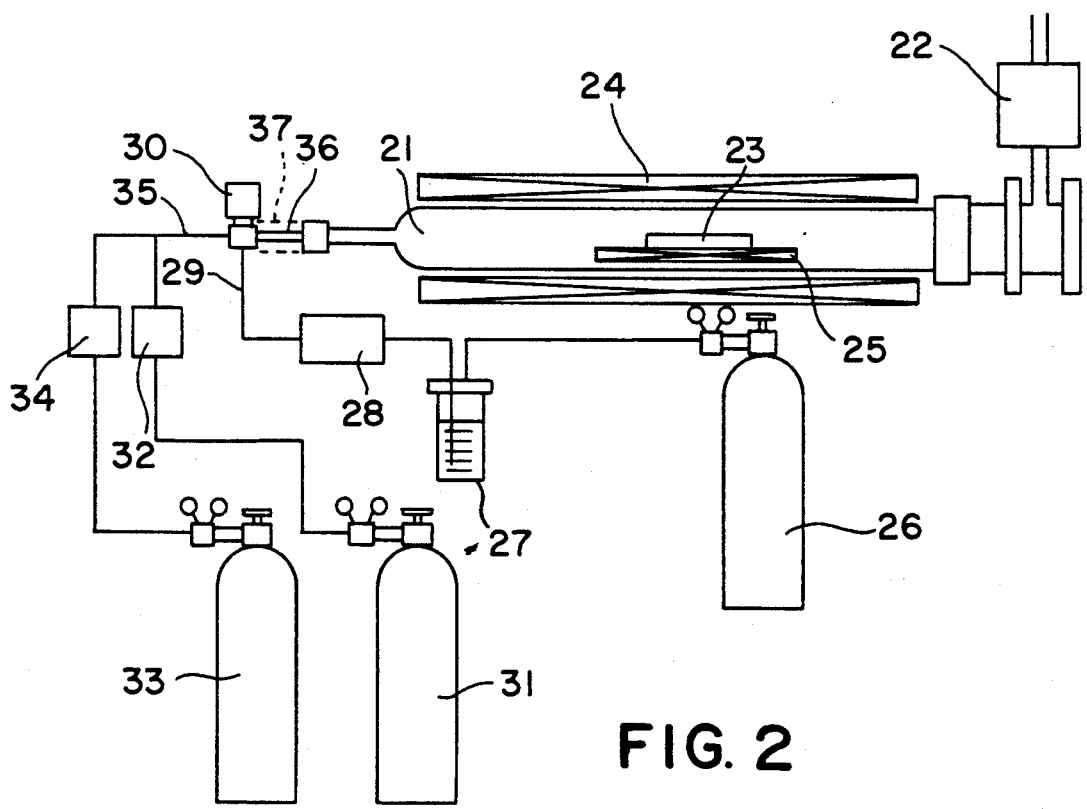
FIG. 2 shows a schematic view of an apparatus for producing a film of tantalum oxide of Embodiment 1 according to the present invention.
Figure 4:
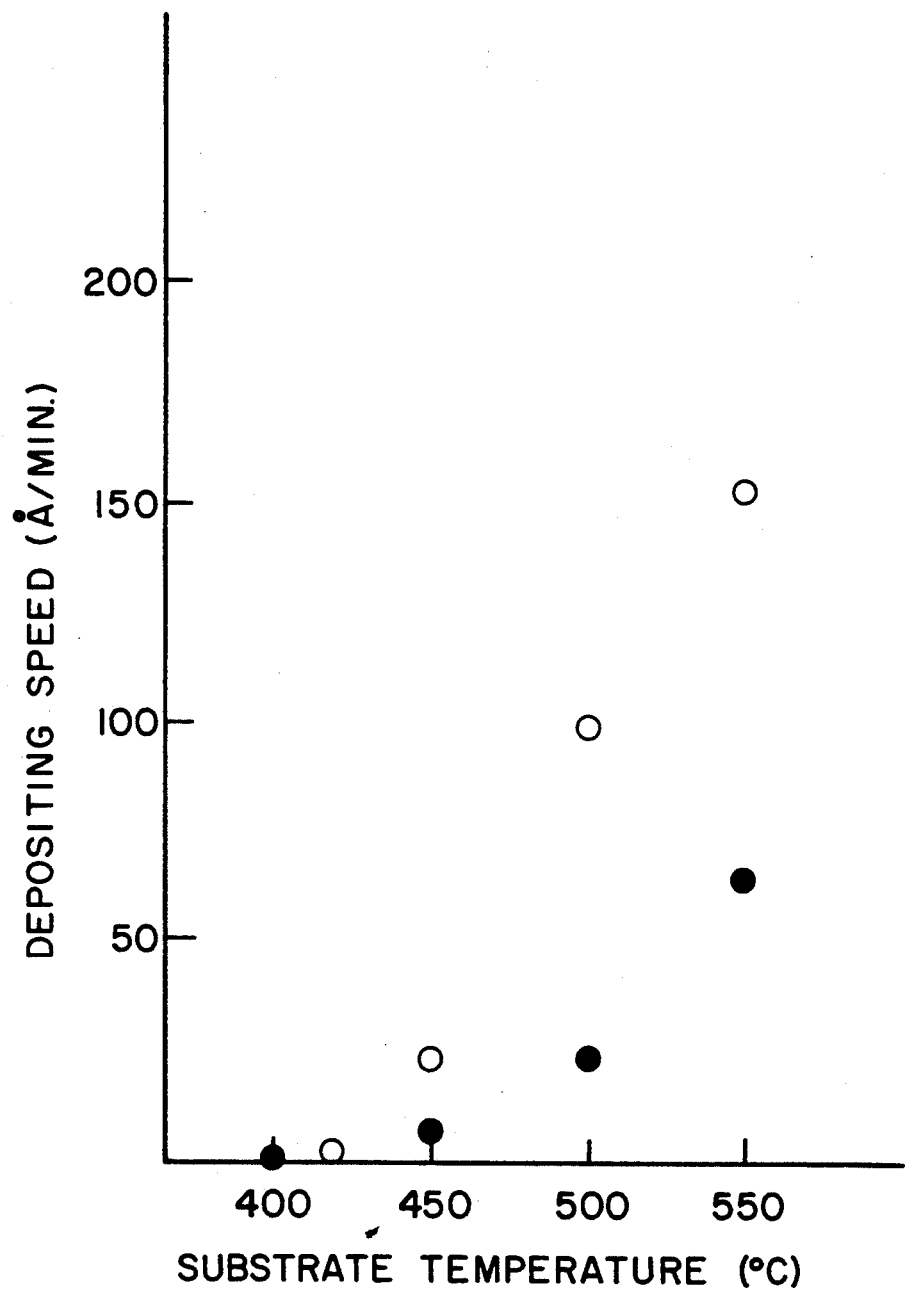
FIG. 4 is a graph showing the relationship of depositing speed of the tantalum oxide film and the substrate temperature in the film-producing apparatus of the past and of the Embodiment 1.

In FIG. 4, the depositing speed is shown in relation to the substrate temperature of the tantalum oxide film by both the apparatus according to the invention of FIG. 2 and the conventional apparatus, the circle (unfilled) being of the former and the filled circle being for the latter.

As is observed, the depositing speed of the tantalum oxide film by the inventive apparatus at the 500° C. substrate-temperature is about 100 angstrom/min, whereas that of the conventional apparatus is only about 25 angstrom/min, and, when the substrate temperature is 550° C., that is about 150 angstroms/min for the invented apparatus and about 60 angstrom/min for the conventional one; clearly the invented apparatus being of rapid formation.

With the conventional apparatus, decreasing of the flow rate of the carrier gas resulted in decrease of the depositing speed.

Embodiment 2

Figure 5:
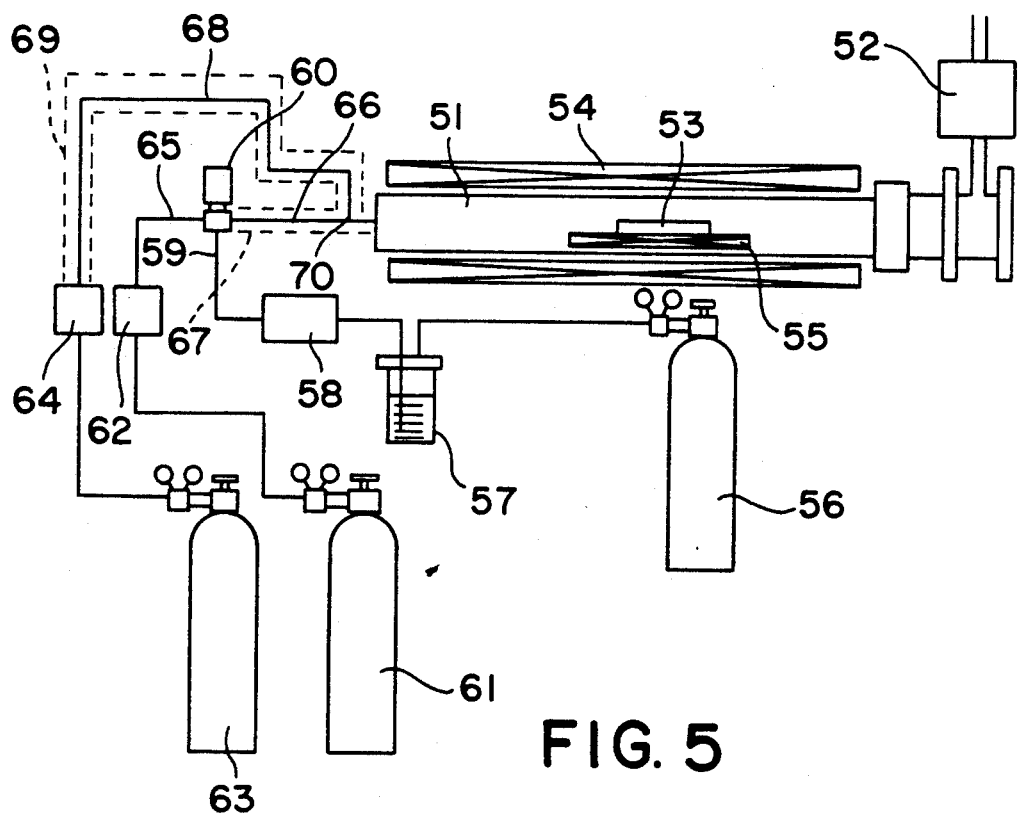
FIG. 5 shows a schematic view of an apparatus of Embodiment 2 of the present invention.

Referring to FIG. 5, another apparatus for producing a thin film of tantalum oxide embodying the invention, comprises a vacuum chamber 51, an ampule 57 containing a liquid organic tantalum compound, $Ta(OC_2H_5)_5$, a container 61 for a carrier gas, a container for oxigen-containing gas 63, and a three way valve 60, like the apparatus of the first embodiment.

Also, like the apparatus of the first embodiment, the vacuum chamber 51, in which a substrate 53 of polysilicon to be covered by a tantalum oxide is laid, is provided with a vacuum pump 52 and two heaters.

The ampule 57 of a liquid organic tantalum compound is provided with a means to press out the liquid organic tantalum compound.

The trigonal valve 60 has two inlets and an outlet, the two inlets being a gas inlet and a liquid inlet. The liquid inlet is connected through a liquid introducing pipe 59 to the ampule 57 as is the case of Embodiment 1. The gas inlet, however, is connected through a gas-introducing pipe 65 to the carrier gas container only, and the outlet is connected not only with the inlet of the vacuum chamber 51 but also with the container of the oxygen-containing gas through a gas-introducing pipe 68.

In the apparatus described above, the liquid tantalum oxide in the ampule 57 is introduced to the liquid inlet of the three way valve 60 by the rate of 0.01 g/min controlled by the flow controller, while the carrier gas, in this embodiment argon, is led to the gas inlet of the three way valve, the flow rate being controlled at 500 sccm by the flow controller.

The carrier gas, at the three way valve 60, spouts, forming the spray of the organic tantalum compound, and the both are heated in the gas-transferring pipe 66 by the heater 67 up to 200° C., whereby the tantalum compound is vaporized.

The oxygen-containing gas is introduced through a gas pipe 68 heated by a heater 69 up to 250° C. to the connecting part 70 of the gas-transferring pipe 66 and the inlet of the vacuum chamber 51, where it is mixed with the carrier gas containing vaporized tantalum compound to form a mixed raw-material gas.

The mixed raw-material gas is introduced to the vacuum chamber 51, which is heated to 250° C. by the heater 54, and react, in the vicinity of the substrate 53 of polysilicon heated up to 450° C. by the heater 55, resulting in the deposition of tantalum oxide film on the surface thereof.

Figure 6:
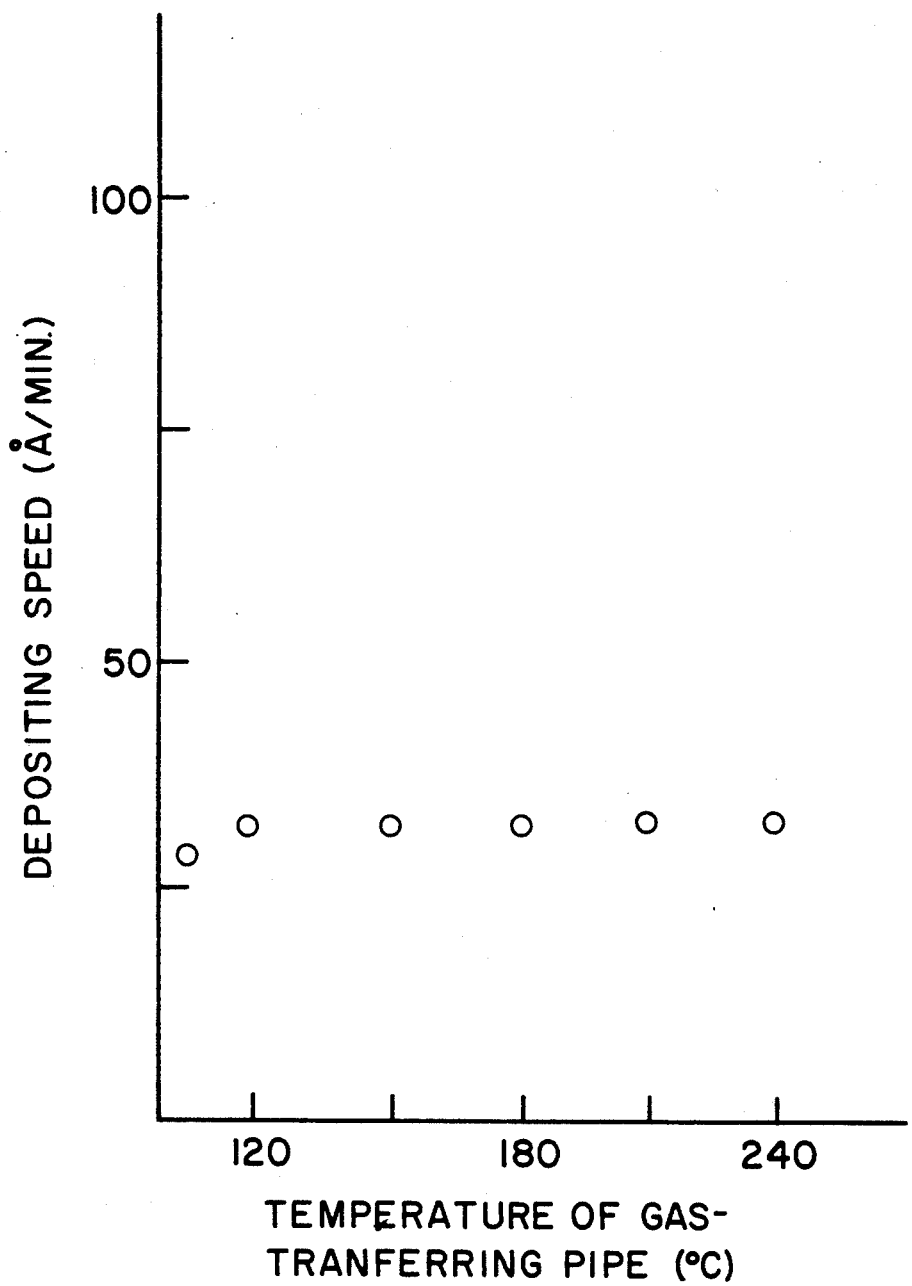
FIG. 6 is a graph of depositing speed of the tantalum oxide film versus temperature of the gas-transferring pipe in the apparatus of the Embodiment 2 according to the invention.
Figure 7:
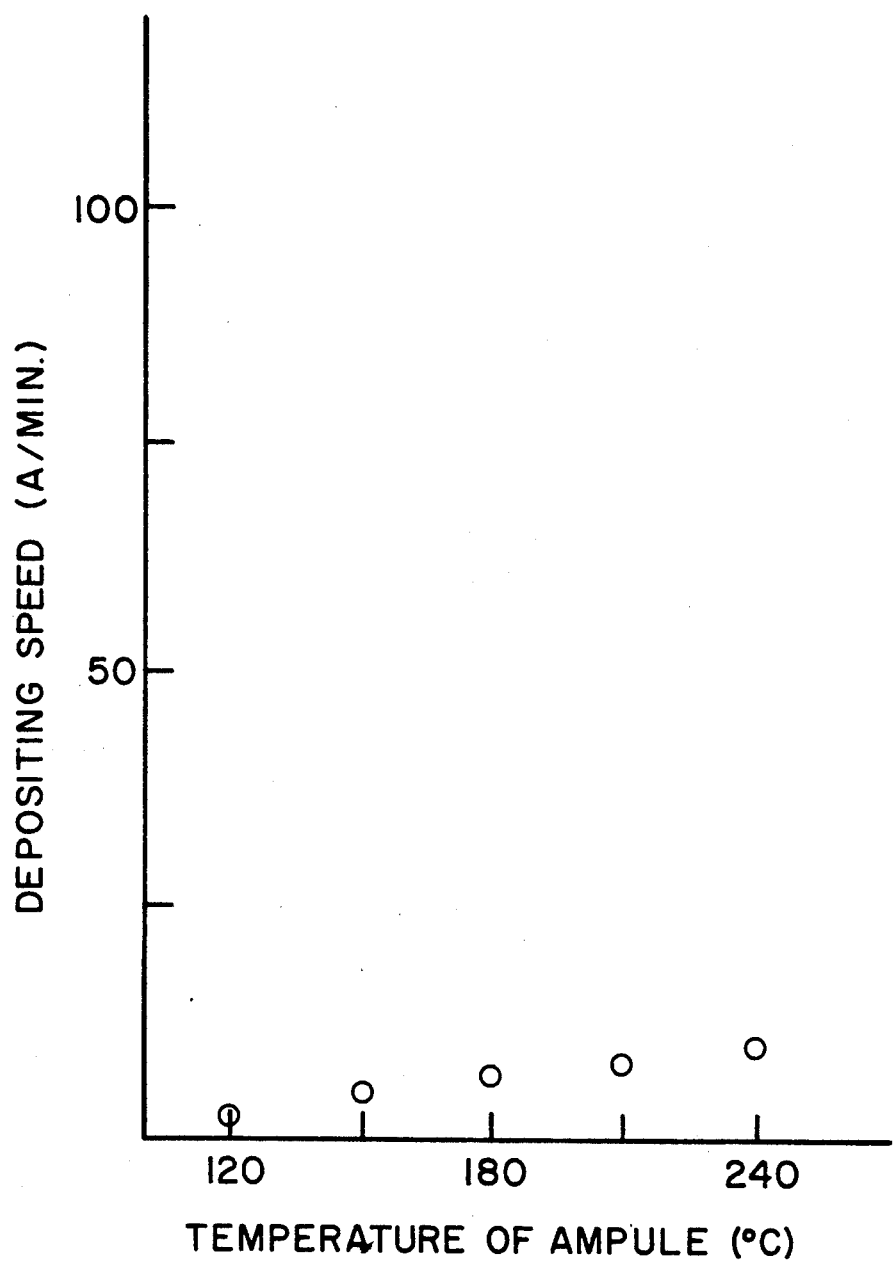
FIG. 7 is a graph showing the relationship between the depositing speed of the tantalum oxide and the temperature of the ampule of the conventional film-producing apparatus.

FIG. 6 gives the variation of the deposition speed of tantalum oxide against the change of the temperature of the gas-transferring pipe 66 for the apparatus of Embodiment 2, while FIG. 7 shows the deposition speed variation against the change of the temperature of the ampule 5 with the conventional apparatus. In both cases, the substrate temperature was 450° C., oxygen gas flow rate was 200 sccm, argon gas flow rate was 500 sccm, and the gas pressure in the vacuum chamber was 1 Torr.

It is observed that the depositing speed of tantalum oxide with the conventional apparatus shown in FIG. 1 varies considerably with the change of temperature of the ampule 5, whereas that by the apparatus of the Embodiment 2 of FIG. 5 is nearly constant if the gas-transferring pipe 66 is kept at a temperature higher than 120° C., producing a tantalum oxide film of uniform quality.

The oxygen-containing-gas-inntroducing pipe 69 connected to the connecting part 70 as described above may be connected directly to the vacuum chamber 51.

As the organic tantalum compound, not only Ta(OC$_2$H$_5$)$_5$ used in the above embodiments, but other ones such as Ta(OC$_3$H$_9$)$_5$ or Ta(OC$_4$H$_9$)$_5$ can be applicable.

The supplying speed of the organic tantalum compound is preferred to be within the range of 0.001 to 0.5 g/min.

The temperature of the inner wall of the vacuum chamber is usually 200° to 400° C., and that of the gas-transferring pipe is 120° to 300° C. The gas pressure in the vacuum chamber is preferred to be within the range of 0.5 to 10 Torr.

As the carrier gas, not confined to any kind, Ar or He is used. As the oxygen-containing gas, it is sufficient if it can react with the organic tantalum compound at low pressure to form tantalum oxide, and usually, simple oxygen or N$_2$O is used, but it is not confined to these.

As for the flow rate of the carrier gas of of the oxygen-containing gas it is preferred to be in the range of 50–1000 sccm.

As the material for the substrate, not especially confined, polysilicon or tungsten silicide (WSi) is used.

What is claimed is:

1. An apparatus for producing a thin film of tantalum oxide comprising:
   a vacuum chamber having a heater for heating the inside thereof;
   an ampule of an organic tantalum compound;
   a container of a carrier gas;
   a container of an oxygen-containing gas; and
   a valve having a liquid inlet, a gas inlet and an outlet, the liquid inlet being connected with the ampule via a liquid flow controller, the gas inlet being connected with the container of a carrier gas and the container of an oxygen-containing gas, and the outlet being connected with the vacuum chamber.

2. The apparatus for producing a thin film of tantalum oxide according to claim 1, wherein the said outlet of the valve is equiped with a gas-transferring pipe having a heater.

3. An apparatus for producing a thin film of tantalum oxide comprising:
   a vacuum chamber having a heater for heating the inside thereof;
   an ampule of an organic tantalum compound;
   a container of a carrier gas;
   a container of an oxygen-containing gas;
   a valve having a liquid inlet; an gas inlet and an outlet, the liquid inlet being connected with the ampule via a liquid flow controller, the gas inlet being connected with the container of a carrier gas and the outlet being connected with the vacuum chamber,
   and the container of an oxygen-containing gas being connected with the vacuum chamber through a gas-introducing pipe.

4. The apparatus for producing a thin film of tantalum oxide according to claim 3, wherein the said gas-introducing pipe is provided with a heater.

* * * * *